(12) United States Patent
Takeuchi et al.

(10) Patent No.: US 6,770,421 B2
(45) Date of Patent: Aug. 3, 2004

(54) PHOTO- OR HEAT-CURABLE RESIN COMPOSITION AND MULTILAYER PRINTED WIRING BOARD

(75) Inventors: Masahiko Takeuchi, Kisarazu (JP); Kazuhiko Mizuuchi, Kisarazu (JP); Hironobu Kawasato, Tokyo (JP)

(73) Assignee: Nippon Steel Chemical, Co., Ltd, Tokyo (JP)

( * ) Notice: Subject to any disclaimer, the term of this patent is extended or adjusted under 35 U.S.C. 154(b) by 0 days.

(21) Appl. No.: 09/996,938

(22) Filed: Nov. 30, 2001

(65) Prior Publication Data

US 2002/0103270 A1 Aug. 1, 2002

(30) Foreign Application Priority Data

Nov. 30, 2000 (JP) ....................... 2000/365012

(51) Int. Cl.⁷ .................. G03F 7/027; G03F 7/004; G03F 7/028; H05K 3/00
(52) U.S. Cl. .................. 430/280.1; 430/18; 430/14; 522/101; 526/247; 526/284; 526/279; 428/414
(58) Field of Search .................. 430/14, 18, 285.1, 430/280.1; 428/414; 522/101; 426/247, 284, 279

(56) References Cited

U.S. PATENT DOCUMENTS

| | | | |
|---|---|---|---|
| 3,255,004 A | * | 6/1966 | Thommes .................. 96/35 |
| 3,380,831 A | * | 4/1968 | Cohen et al. .................. 96/115 |
| 4,970,135 A | * | 11/1990 | Kushi et al. ............. 430/280.1 |
| 5,196,296 A | | 3/1993 | Watanabe et al. |
| 5,721,076 A | | 2/1998 | Watanabe et al. |
| 6,465,540 B1 | * | 10/2002 | Kubo et al. .................. 522/100 |

OTHER PUBLICATIONS

"Alkylene", Grant et al, eds, Grant & Hackh's Chemical Dictionary, fifth edition, McGraw–Hill Book Company, New York, N.Y. 1987, p. 24.*
Abstract for EP 0421086 A3, 1 page from esp@cenet database–12, No Date.
Abstract for JP–04–355450, Japanese Patent Office, copyright 1998, 2000.
Abstract for JP 10–161306,Japanese Patent Office, 1 page, copyright 1998,2000.

* cited by examiner

Primary Examiner—Cynthia Hamilton
(74) Attorney, Agent, or Firm—Birch, Stewart, Kolasch & Birch, LLP

(57) ABSTRACT

This invention relates to a photo- or heat-curable resin composition which yields a cured product with minimal cracking and high reliability. The resin composition of this invention comprises 100 parts by weight of (A) photo- or heat-polymerizable unsaturated compound composed of a polycarboxylic acid adduct of bisphenol-epoxy (meth) acrylate, 10–100 parts by weight of (B) alkylene oxide-modified product of (meth)acrylate or oligomers thereof, 0–50 parts by weight of (C) compound containing epoxy group and 0–50 parts by weight of (D) photopolymerization initiator or sensitizer. The composition exhibits high heat resistance and good microfabrication quality and is useful as a peripheral material of electronic parts such as semiconductor devices by the build-up process, for example, as a material for forming insulation layers in multilayer printed wiring boards.

5 Claims, No Drawings

PHOTO- OR HEAT-CURABLE RESIN COMPOSITION AND MULTILAYER PRINTED WIRING BOARD

FIELD OF THE INVENTION

This invention relates to a photo- or heat-curable resin composition suitable for insulating a printed wiring board and to a multilayer printed wiring board containing an insulating resin layer formed from said photo- or heat-curable resin composition.

BACKGROUND OF THE INVENTION

In recent years, the on-going miniaturization of electronic instruments has led to the development of a multi-level system for printed wiring in order to attain a higher degree of integration of electronic devices and the so-called build-up process which is put into practice by forming an insulating layer and a conductive layer alternately and laminating them together has come into frequent use. And here, high reliability is demanded for the resin materials to be used for insulation. Moreover, it is often the case that a printed wiring board is covered with an insulating layer to protect the surface or the mounted chips.

In the use of insulating materials based on organic resins in multilayer printed wiring boards, however, the organic resins differ greatly in the thermal expansion coefficient from the active parts such as semiconductor devices and the passive parts such as capacitative elements and resistors and, still more, from substrates such as sintered alumina materials, epoxy resins on glass cloth formed by impregnating glass cloth woven from glass fibers with epoxy resins, and silicon wafers; in case a large thermal stress results from the difference in the thermal expansion coefficient between the organic resins and other components, the stress causes cracking and splitting apart of semiconductor devices, capacitative elements, and conductive wirings and the affected devices cease to function normally.

By the way, the use of resin compositions containing epoxy acrylates in printed wiring boards is known from old. For example, Japanese patent publication JP03-205417A (1991) and JP04-355450A (1992) disclose photosensitive resin compositions usable as solder resist or electroless plating resist in the manufacture of printed wiring boards, but they cannot produce a satisfactory effect in the reliability test, typically the cold and heat shock test, in case they are used as permanent resist in printed wiring boards.

On the other hand, JP10-161306A (1998) describes photosensitive resin compositions containing ethylenically unsaturated carboxylic acids wherein 50% by weight or more of ethylene oxide-modified trimethylolpropane triacrylate is incorporated in the ethylenically unsaturated carboxylic acids. However, the photosensitive resin compositions in question are primarily used as etching resist or plating resist and finally peeled off. In consequence, the invention in question differed in the mode of usage from this invention which is concerned with a permanent resist without final peeling off.

Accordingly, an object of this invention is to provide a photo- or heat-curable resin composition which cures into a film of high reliability as tested by the cold and heat shock test which is a typical test for reliability of substrates as a resin composition for forming a resin insulating layer in a wiring board. Another object of this invention is to provide a resin composition which can be processed to yield fine patterns. A further object of this invention is to provide a cured resin which is heat- and solvent-resistant and suitable for use as an interlayer insulating layer in a printed wiring board such as a multilayer printed wiring board.

SUMMARY OF THE INVENTION

The present inventors have conducted intensive studies on a method for preventing the generation of minute cracks which would cause insulation breakdown in the reliability test of the substrate, found that the use of an acrylate having a specific structure, namely that of an alkylene oxide, as an acrylic monomer or oligomer can produce an effect to prevent cracking of an insulating material derived from a resin composition and completed this invention.

A photo- or heat-curable resin composition of this invention comprises 100 parts by weight of (A) unsaturated compound having a structural unit represented by the following general formula (1)

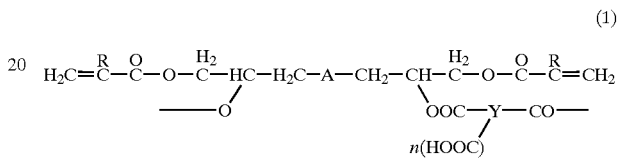

(wherein R is hydrogen or methyl group, A is a group represented by the formula (2), Y is the residue of a polycarboxylic acid or acid anhydride thereof, and n is an integer of 0–3),

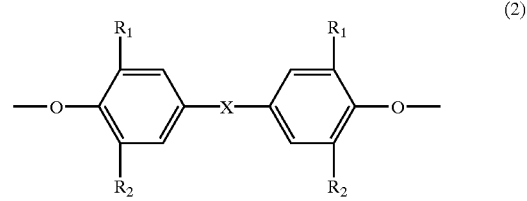

(wherein $R_1$ and $R_2$ are hydrogen, an alkyl group with 1–5 carbon atoms, or a halogen and X is —CO—, —SO$_2$—, —C(CF$_3$)$_2$—, —Si(CH$_3$)$_2$—, —CH$_2$—, —C(CH$_3$)$_2$—, —O—, —S—, group represented by the formula (3) or single bond),

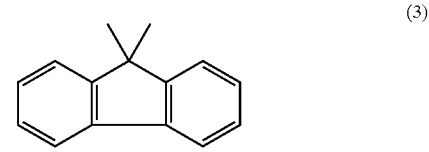

10–100 parts by weight of (B) alkylene oxide-modified product of at least one kind of acrylate selected from (meth)acrylates or oligomers thereof, 0–50 parts by weight of (C) compound containing epoxy group and 0–10 parts by weight of (D) photopolymerization initiator or sensitizer. Here, it is preferable that at least a part of the unsaturated compound (A) is an unsaturated compound containing the fluorene skeleton represented by the formula (3) in its structural unit. It is also preferable to incorporate 100 parts by weight or less of at least one kind of other unsaturated compound (E) selected from monomers and oligomers other than the components A and B per 100 parts by weight of the component A.

Furthermore, this invention relates to the cured product obtained from the aforementioned photo- or heat-curable resin composition and to the substrate of a printed wiring board containing at least one layer of said cured product as insulating layer.

DETAILED DESCRIPTION OF THE INVENTION

This invention will be described in detail below.

Unsaturated compounds (A) containing a structural unit represented by the general formula (1) include compounds that contain ethylenic unsaturated bonds and are occur as liquid at normal temperature. Preferable among them are those which are mainly, say 80% by weight or more, composed of unsaturated compounds containing the fluorene skeleton represented by the formula (3) as X.

The component (A) can be prepared, for example, by epoxidizing a bisphenol which contains X at its center, treating the epoxidized bisphenol with (meth)acrylic acid, and then treating the resulting (meth)acrylate with the anhydride of a polybasic acid.

Unsaturated compounds (A) contain 80 mol % or more on the average, preferably 90 mol % or more, of a structural unit represented by the general formula (1) and additionally other structural units such as oligomers with two or more repeating units formed as by-product during the epoxidation of bisphenols. Unsaturated compounds containing a structural unit represented by the general formula (1) may be either oligomers or monomers; they are usually a mixture of compounds differing in the degree of polymerization and A, R, Y, n, $R_1$ and $R_2$ need not be identical in a given molecule or unsaturated compound (A) and can vary freely within the defined range.

The procedure for preparing the component (A) is not limited to the aforementioned; for convenience' sake, however, the aforementioned procedure will be explained below.

Bisphenols are typically dihydroxy compounds derived from the general formula (2) by adding H to each terminal O—.

Concrete examples of useful bisphenols are as follows: bis(4-hydroxyphenyl) ketone, bis(4-hydroxy-3,5-dimethylphenyl) ketone and bis(4-hydroxy-3,5-dichlorophenyl) ketone for X=—CO— in the general formula (1) and (2); bis(4-hydroxyphenyl) sulfone, bis(4-hydroxy-3,5-dimethylphenyl) sulfone and bis(4-hydroxy-3,5-dichlorophenyl) sulfone for X=—$SO_2$—; 2,2-bis(4-hydroxyphenyl)-hexafluoropropane, 2,2-bis(4-hydroxy-3,5-dimethylphenyl)hexafluoropropane and 2,2-bis(4-hydroxy-3,5-dichlorophenyl)hexafluoropropane for X=—$C(CF_3)_2$—; bis(4-hydroxyphenyl)dimethylsilane, bis(4-hydroxy-3,5-dimethylphenyl)-dimethylsilane and bis(4-hydroxy-3,5-dichlorophenyl)dimethylsilane for X=—$Si(CH_3)_2$—; bis(4-hydroxyphenyl)methane, bis(4-hydroxy-3,5-dibromophenyl)-methane and bis(4-hydroxy-3,5-dichlorophenyl)methane for X=—$CH_2$—; 2,2-bis(4-hydroxyphenyl)propane, 2,2-bis(4-hydroxy-3,5-dimethylphenyl)propane and 2,2-bis(4-hydroxy-3,5-dichlorophenyl)propane for X=—$C(CH_3)_2$—; bis(4-hydroxyphenyl) ether, bis(4-hydroxy-3,5-dimethylphenyl) ether and bis(4-hydroxy-3,5-dichlorophenyl) ether for X=—O—; bis(4-hydroxyphenyl) sulfide, bis(4-hydroxy-3,5-dimethylphenyl) sulfide and bis(4-hydroxy-3,5-dichlorophenyl)sulfide for X=—S—; 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)-fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene and 9,9-bis(4-hydroxy-3,5-dibromophenyl)fluorene for X=fluoren-9-ylidene; and 4,4'-dihydroxybiphenyl and 3,3'-dihydroxybiphenyl for X=direct bond.

The epoxidization of the aforementioned bisphenols can be effected in the usual manner. For example, a bisphenol is dissolved in excess epichlorohydrin and allowed to react in the presence of an alkali metal hydroxide such as sodium hydroxide and potassium hydroxide at 50–150° C., preferably at 60–120° C., for 1–10 hours.

The reaction of an epoxy compound and (meth)acrylic acid is effected by treating each 1 mole of the epoxy group in the epoxy compound with 0.8–1.5 moles, preferably 0.9–1.1 moles, of (meth)acrylic acid. In this reaction, methyl ethyl ketone or Methyl Cellosolve acetate may be used as a diluent. Also, a catalyst such as triethylamine, benzyldimethylamine, methyl-triethyl-ammonium chloride and triphenylphosphine may be used to accelerate the reaction. The catalyst is used in an amount corresponding normally to 0.1–10% by weight, preferably to 0.3–5% by weight, of the reactant mixture, the reaction temperature is kept at 60–150° C., preferably at 80–120° C., and the reaction time is 5–60 hours, preferably 10–50 hours.

The group Y in the aforementioned general formula (1) designate the residue of a polycarboxylic acid or its acid anhydride having 2–5 carboxyl group and, preferably, Y is the residue of an acid anhydride or an acid dianhydride.

Polycarboxylic acids or their acid anhydrides that can form such residues as Y include maleic acid, succinic acid, itaconic acid, phthalic acid, tetrahydrophthalic acid, hexahydrophthalic acid, methyl-endomethylenetetrahydrophthalic acid, chlorendic acid, methyltetrahydrophthalic acid, benzene tricarboxylic acid, pyromellitic acid, benzophenonetetracarboxylic acid, biphenyltetracarboxylic acid, and diphenyl ether tetracarboxylic acid and their anhydrides. They can be used singly or as a mixture of two kinds or more.

In the cases where a dibasic acid, a tribasic acid, a tetrabasic acid or a pentabasic acid or the anhydride of respective acid is used, n in the general formula (1) becomes respectively 0, 1, 2 and 3.

The reaction of an epoxy (meth)acrylate with a polycarboxylic acid (or its acid anhydride) can be effected in a known manner. A polycarboxylic acid or its acid anhydride to be used here is preferably a dibasic or higher carboxylic acid or its anhydride or a mixture so that the resulting unsaturated compound (A) exhibits an acid value of 10 mg KOH/g or more and manifests sufficient solubility in alkali.

The unsaturated compound (A) or component (A) represented by the aforementioned general formula (1) is not necessarily limited to the aforementioned compounds and it may be used as a mixture of two kinds or more. Preferably, a monoanhydride and a dianhydride of polycarboxylic acids are used simultaneously at a molar monohydride/dianhydride ratio 0/100–100/0, more preferably 10/90–90/10. Moreover, it is preferable that the inherent viscosity of a solution of 0.5 g of the component (A) in 100 ml of N-methylpyrrolidone at 30° C. is 0.1 dl or more.

Next, an explanation will be given of (B) alkylene oxide-modified product of at least one kind of (meth)acrylate selected from (meth)acrylates or oligomers thereof or the component (B). There are instances where component (B) is alkylene oxide-modified (meth)acrylate, alkylene oxide-modified (meth)acrylate oligomers or a mixture of the two.

(Meth)acrylates (meaning acrylates and/or methacrylates) to be used as raw material for alkylene oxide-modified products (B) includes the following compounds.

Hydroxy (meth)acrylate such as hydroxyethyl (meth) acrylate hydroxypropyl (meth) acrylate, 2-hydroxyethylhexyl (meth) acrylate, polyethylene glycol mono (meth) acrylate, polypropylene glycol mono(meth) acrylate, butanediol mono (meth) acrylate, and chlorohydroxypropyl (meth) acrylate; aliphatic (meth)acrylates such as allyl (meth)acrylate, butoxyethyl (meth)acrylate, triethylene glycol butyl ether (meth) acrylate, t-butylaminoethyl (meth) acrylate, caprolactone (meth) acrylate, butyl (meth) acrylate, hexyl (meth) acrylate, cyanoethyl (meth) acrylate, dimethylaminoethyl (meth) acrylate, diethylamino (meth) acrylate, ethoxyethyl (meth) acrylate, ethylhexyl (meth) acrylate, isodecyl (meth) acrylate, isooctyl (meth) acrylate, lauryl (meth) acrylate, octyl (meth) acrylate, stearyl (meth) acrylate, succinic acid (meth)acrylate, methacryloyloxypropyl-trimethoxysilane, methoxyethyl (meth) acrylate, cyclodecatrienyl (meth) acrylate, glycerol (meth) acrylate, glycidyl (meth) acrylate, isocyanatoethyl (meth) acrylate, heptadecafluorooctyl (meth) acrylate, octafluoropentyl (meth) acrylate, tetrafluoropropyl (meth) acrylate, trifluoroethyl (meth)acrylate, and dibromopropyl (meth)acrylate; alicyclic-modified (meth)acrylates such as cyclohexyl (meth) acrylate, dicyclopentanyl (meth) acrylate, dicyclopentenyl (meth) acrylate, isobornyl (meth) acrylate, tetrahydrofurfuryl (meth) acrylate, and morpholino (meth) acrylate; aromatic (meth)acrylates such as phenoxyethyl (meth)acrylate, phenoxyhydroxypropyl (meth) acrylate, polypropylene glycol nonylphenyl ether (meth)acrylate, phenyl (meth)acrylate, phthalic acid (meth)acrylate, and benzyl (meth)acrylate; phosphorus-containing (meth) acrylates such as phenoxylated phosphoric acid (meth) acrylate, phosphoric acid (meth) acrylate, butoxylated phosphoric acid (meth)acrylate, and octoxylated phosphoric acid (meth)acrylate; and water-soluble (meth)acrylates such as sodium sulfonate (meth)acrylate.

The monomers in question also include the following bifunctional compounds: ethylene glycol di(meth)acrylate, diethylene glycol di(meth)acrylate, hexanediol di(meth) acrylate, di(meth)acrylates of long-chain aliphatic diols, neopentyl glycol di(meth)acrylate, hydroxypivalic acid neopentyl glycol di(meth)acrylate, stearic acid-modified pentaerythritol di(meth)acrylate, propylene glycol di(meth) acrylate, glycerol di(meth)acrylate, triethylene glycol di(meth)acrylate, tetraethylene glycol di(meth)acrylate, triethylene glycol divinyl ether, tetramethylene glycol di(meth)acrylate, butylene glycol di(meth)acrylate, dicyclopentanyl di(meth)acrylate, polyethylene glycol di(meth) acrylate, polypropylene glycol di(meth)acrylate, triglycerol di(meth)acrylate, neopentyl glycol-modified trimethylolpropane di(meth)acrylate, allylated cyclohexyl di(meth) acrylate, methoxylated cyclohexyl di(meth)acrylate, acrylic group-substituted isocyanurate, bis(acryloyloxyneopentyl) adipate, bisphenol A di(meth)acrylate, tetrabromobisphenol A di(meth)acrylate, bisphenol S di(meth)acrylate, butanediol di(meth)acrylate, phthalic acid di(meth)acrylate, phosphoric acid di(meth)acrylate, zinc di(meth)acrylate.

Furthermore, the monomers in question include the following trifunctional or higher compounds: trimethylolpropane tri(meth)acrylate, trimethylolethane tri(meth) acrylate, glycerol tri(meth)acrylate, pentaerythritol tri(meth) acrylate, alkyl-modified dipentaerythritol tri(meth)acrylate, phosphoric acid tri(meth)acrylate, tris((meth)acryloyloxyethyl) isocyanurate, pentaerythritol tetra(meth)acrylate, dipentaerythritol tetra(meth)acrylate, ditrimethylol-propane tetraacrylate, alkyl-modified dipentaerythritol tetra(meth) acrylate, dipentaerythritol penta(meth)acrylate, dipentaerythritol hexa(meth)acrylate, alkyl-modified dip entaerythritol penta(meth) acrylate, urethane tri(meth) acrylate, ester tri(meth)acrylate, urethane hexa(meth) acrylate, ester hexa(meth)acrylate, etc.

(Meth)acrylate oligomers to be used as raw material for alkylene oxide-modified products (B) of this invention include the oligomers of the aforementioned (meth) acrylates.

These monofunctional, bifunctional, trifunctional and higher (meth)acrylates or oligomers thereof may naturally be used singly or as a mixture of two kinds or more.

The component (B) or alkylene oxide-modified product can be compounds obtained by treating any of the aforementioned (meth)acrylates or oligomers thereof with an alkylene oxide. A typical alkylene oxide is ethylene oxide and propylene oxide.

Next, an explanation is made of a compound containing epoxy group or the component (C).

A compound containing an epoxy group or the component (C) is used for the purpose of improving adhesion and alkali resistance. Examples of such a compound include epoxy resins such as phenol novolak epoxy resins, cresol novolak epoxy resins, bisphenol A epoxy resins, bisphenol F epoxy resins, bisphenol S epoxy resins, biphenyl type epoxy resins, and alicyclic epoxy resins and compounds containing at least one epoxy group such as phenyl glycidyl ether, p-butylphenyl glycidyl ether, triglycidyl isocyanurate, allyl glycidyl ether and glycidyl methacrylate.

It is permissible to use a curing agent for epoxy compounds together with the component (C), but there is no need of that in case a compound containing a carboxyl group such as the component (A) is present.

In addition to the aforementioned component (A), component (B) and component (C) (contained whenever a curing agent is used) as resin or resin-forming component (the two may be put together and hereinafter referred to as resin component), a photo- or heat-curable resin composition of this invention may further contain at least one kind of other unsaturated compound (E) selected from other photopolymerizable monomers and oligomers thereof (hereinafter also referred to as component (E)). Useful as such component (E) are a variety of vinyl monomers containing one or more unsaturated groups, for example, (met)acrylic acid, (meth) acrylates, styrene, various oligomers and hydrocarbon resins.

In case higher photocurability or higher sensitivity is required in addition to alkali solubility for a resin composition of this invention, it is preferable to incorporate oligomers or monomers containing two or more polymerizable double bonds in the molecule (bifunctional), more preferably three (trifunctional) or more, in the composition.

Regarding the proportion of the aforementioned oligomers and monomers, the following would generally happen where good photocurability is required; less-than-adequate incorporation of trifunctional and higher acrylates does not advance photocuring sufficiently and sometimes causes dissolution of the exposed part while excessive incorporation may have consequences that even the unexposed part cannot be developed and there is the possibility of a loss of the tack-free property depending upon the degree of polymerization and the structure of acid anhydrides.

The resin component is formulated from 100 parts by weight of the component (A), 10–100 parts by weight, preferably 20–70 parts by weight, of the component (B), 0–50 parts by weight, preferably 10–40 parts by weight, of the component (C) and 0–100 parts by weight, preferably 0–40 parts by weight, of the component (E).

An adequate composition of the resin component is 30–80 wt % of the component (A), 10–40 wt % of the component (B) and 5–50 wt % of the component (C).

Moreover, a photopolymerization initiator or sensitizer to be used in this invention or the component (D) is used as a photopolymerization initiator of those unsaturated compounds which are used as the components (A) and (B).

The component (D) to be used for such a purpose includes known photopolymerization initiators such as radical-generating Michler's ketone and cation-generating triarylsulfonium salts and diaryliodonium salts and these initiators can be used singly or as a mixture of two kinds or more. The component (D) is not always necessary in case the resin composition is thermally polymerizable, but it gains importance when patterns are formed by such steps as exposure to light and development.

The aforementioned photopolymerization initiators can be used in combination with known photosensitizers such as ethyl N,N-dimethylaminobenzoate, isoamyl N,N-dimethylaminobenzoate, triethanolamine and triethylamine and the photosensitizers here may be used singly or as a mixture of two kinds or more.

The aforementioned photopolymerization initiator or sensitizer is used at a combined proportion of 0–10 parts by weight, preferably 0.01–10 parts by weight, more preferably 1–5 parts by weight, per 100 parts by weight of the component (A). In case the resin-forming component is used, the photopolymerization initiator or sensitizer in question is incorporated at a rate of 0.1–10 parts by weight, preferably 1–5 parts by weight, per 100 parts by weight of the resin and resin-forming component. Use of more than 10 parts by weight increases light absorption and develops the possibility of light not penetrating to the lower region.

It is allowable to incorporate, together with the aforementioned essential components, additives such as curing accelerators for epoxy resins, polymerization inhibitors plasticizers, leveling agents, and antifoaming agents in a photo- or heat-curable resin composition of this invention as needed. Such additives include the following compounds: amines, imidazoles, carboxylic acids, phenols, quaternary ammonium salts, and methylol group-containing compounds as curing accelerators for epoxy resins; hydroquinone, hydroquinone monomethyl ether, pyrogallol, tert-butylcatechol, and phenothiazine as thermal polymerization inhibitors; dibutyl phthalate, dioctyl phthalate, and tricresyl phosphate as plasticizers; and silicones, fluorine-containing compounds, and acrylic compounds as antifoaming agents and leveling agents.

Moreover, the viscosity of a photo- or heat-curable resin composition of this invention can be adjusted by incorporating a solvent as needed. A solvent for this use needs to be capable of dissolving the aforementioned matrix resin component and yet non reactive with the resin in the matrix resin component and the additives and, as long as these conditions are satisfied, there are no other restrictions.

A photo- or heat-curable resin composition of this invention is formulated so that it comprises 99–80% by weight of the resin-forming component, 0.1–20% by weight of an initiator and other additives exclusive of a solvent and the viscosity is adjusted to the desired value by proper incorporation of a solvent.

Furthermore, it is possible to use a photo- or heat-curable resin composition of this invention in the form of dry film.

A photo- or heat-curable resin composition of this invention can be exposed to light and developed and is usable as an insulating material or adhesive on which fine patterns need to be formed. In particular, the composition is useful as a material for forming an insulating layer on a wiring board. The composition cures to form film of high reliability and such cured film is useful as a protective film and an insulating layer.

The method of forming a conductive layer on the surface of a layer of cured resin is not restricted. For example, a circuit is formed by applying a resin composition to the base material by spin coating or curtain coating, drying, exposing to light, developing and curing by heat. The surface of the cured resin is planarized by buffing as needed and a known dry plating process is applied. Then, a known process for electrolytic copper plating is applied to form a conductive layer.

Furthermore, a multilayer wiring board can be prepared by applying the resin composition to a layer of conductor, forming a circuit, heat-curing and repeating the formation of a layer of conductor. In case the layer of conductor is exposed, the resin composition can further be applied as protective film. The substrate of a printed wiring board of this invention can be made into the substrate of a multilayer wiring board in this manner and, in this case, it is necessary to use a photo- or heat-curable resin composition of this invention as a resin composition to form at least one layer of cured resin; in case the layer of cured resin multiplies in number, the use of a photo- or heat-curable resin composition of this invention in most of the multiple layers can lead to the formation of the highly reliable substrate of a multilayer printed wiring board.

A photo- or heat-curable resin composition of this invention is also used as a protective film on the surface of a wiring board or as a protective insulation layer of chips mounted on a wiring board.

EXAMPLES

Examples 1–3

Oligomer resin (A1) to be used as unsaturated compound (A) is a compound represented by the general formulas (1) and (2) wherein X is the fluorene group represented by the formula (3), $R_1$ and $R_2$ are hydrogen and Y is a mixture of the residues of tetrahydrophthalic acid and biphenyltetracarboxylic acid (BPDA) at the n=0 to n=2 ratio of 1:1 by mole. The oligomer resin (Al) was mixed with additives and dispersed at room temperature in accordance with the recipe shown in Table 1 to give a photo- or heat-curable resin composition which shows a solid resin content of approximately 50 wt % and a viscosity of approximately 200 c.p. at 23° C.

Example 4

Oligomer resin (A2) to be used as unsaturated compound (A) is a compound represented by the general formulas (1) and (2) wherein X is —$CH_2$—, $R_1$ and $R_2$ are hydrogen and Y is a mixture of the residues of tetrahydrophthalic acid and biphenyltetracarboxylic acid (BPDA) at the n=0 to n=2 ratio of 1:1 by mole. The oligomer resin (A2) was mixed with additives and dispersed at room temperature in accordance with the recipe shown in Table 1 to Live a photo- or heat-curable resin composition which shows a solid resin content of approximately 50 wt % and a viscosity of approximately 200 c.p. at 23° C.

Examples 5–7 (Comparative)

Photo- or heat-curable resin compositions were prepared as in Examples 1–4 using the aforementioned unsaturated compound (A1) or (A2) as unsaturated compound (A).

(Components to Be Incorporated and Symbols)

A1; Shown above
A2; Shown above
B1; Trimethylolpropane triacrylate-ethylene oxide adduct (molar ratio 1:6) (Aronix M-360 available from Toagosei Chemical Industry Co., Ltd.)
B2; Trimethylolpropane triacrylate-ethylene oxide adduct (molar ratio 1:3) (Aronix M-350 available from Toagosei Chemical Industry Co., Ltd.)
B3; Trimethylolpropane triacrylate-propylene oxide adduct (molar ratio 1:6) (Aronix M-320 available from Toagosei Chemical Industry Co., Ltd.)
C1; Tetramethylbiphenylepoxy resin (Epikote YX4000 available from Yuka Shell Epoxy Co.)
D1; Sensitizer (Michler's ketone)
D2; Photopolymerization initiator (Irgacure 651 available from Ciba-Geigy)
E1; Dipentaerythritol hexaacrylate (KAYARAD DPHA available from Nippon Kayaku Co., Ltd.)
E2; Trimethylolpropane triacrylate (KAYARAD TMTPA available from Nippon Kayaku Co., Ltd.)
S1; Solvent (propylene glycol monomethyl ether acetate)

Table 1 shows the amounts of components for each photo- or heat-curable resin composition; however, since the amounts of D1, D2 and S1 are fixed at 0.08 g, 2 g and 100 g respectively in examples, they are not shown in Table 1.

TABLE 1

|  | Component A | Component B | Component C | Component E |
|---|---|---|---|---|
| Ex. 1 | A1 60 g | B1 26 g | C1 12 g |  |
| Ex. 2 | A1 60 g | B2 26 g | C1 12 g |  |
| Ex. 3 | A1 60 g | B3 26 g | C1 12 g |  |
| Ex. 4 | A2 60 g | B1 26 g | C1 12 g |  |
| Ex. 5 | A1 60 g | — | C1 12 g | E1 26 g |
| Ex. 6 | A1 60 g | — | C1 12 g | E2 26 g |
| Ex. 7 | A2 60 g | — | C1 12 g | E1 26 g |

The conditions for preparing a base material for evaluation are as follows.

On a commercially available FR-4 base material copper-clad on both sides (MCL-E-67 available from Hitachi Chemical Co., Ltd.: thickness of copper wiring, 18 $\mu$m) were formed 1350×4 dumbbell-shaped patterns and the surface of the copper was roughened by the Neobrown process of Ebara Densan K.K. to prepare a base material for evaluation.

The base material for evaluation was spin-coated with the aforementioned photo- or heat-curable resin composition to a thickness of 20 $\mu$m, dried at 110° C. for 10 minutes, photo-cured by irradiating with a 500-W high-pressure mercury lamp at 200 mj/cm² (i-line), developed by a developer (V-2590D, available from Nippon Steel Chemical Co., Ltd.), and post-cured in air at 180° C. for 90 minutes.

(Method for Evaluating Reliability)

The thermal shock test was conducted under the following conditions to evaluate reliability.

Each of the base materials for evaluation prepared under the aforementioned conditions was subjected to a test consisting of 250 cycles of immersion in a liquid at −65° C. for 5 minutes and then in another liquid at 125° C. for 5 minutes in a thermal shock tester, TSB-1L manufactured by TABAI ESPEC K.K., and the number of cracks on each base material was noted for comparison.

Reliability=[1−(number of cracks/number of total patterns)]×100 (%)

(Method for Evaluating Resolution)

Resolution was assessed by determining the minimum width of line and space with which a circuit can be formed at a film thickness of 20 $\mu$m.

(Method for Evaluating Heat Resistance)

The glass transition temperature (Tg) was determined by a known dynamic viscoelastic method.

The results of evaluation of Examples are shown in Table 2.

TABLE 2

|  | Reliability % | Resolution $\mu$m | Tg °C. |
|---|---|---|---|
| Ex. 1 | 100 | 20 | 200 |
| Ex. 2 | 95 | 20 | 200 |
| Ex. 3 | 95 | 20 | 200 |
| Ex. 4 | 100 | 20 | 200 |
| Ex. 5 | 0 | 20 | 220 |
| Ex. 6 | 0 | 20 | 220 |
| Ex. 7 | 0 | 20 | 220 |

As is apparent from the results of the aforementioned examples, the use of alkylene oxide-modified product (B) produces excellent crack resistance and gives photo- or heat-curable resin compositions of high glass transition temperature (Tg) and high resolution.

Photo- or heat-curable resin compositions of this invention cure into resins with minimal cracking and high reliability. Properly selected resins help to yield resin compositions of good heat resistance due to high glass transition temperature and good microfabrication quality and such resin compositions are useful for forming peripheral materials of electronic parts such as semiconductor devices by the build-up process, for example, insulation layers in multilayer printed wiring boards and WL-CSP.

What is claimed is:

1. A photo- or heat-curable resin composition comprising,
    a) 100 parts by weight of (A) unsaturated compound having a structural unit represented by the following general formula (1)

$$H_2C=\overset{R}{C}-\overset{O}{C}-O-\overset{H_2}{C}-HC-H_2C-A-CH_2-CH-\overset{H_2}{C}-O-\overset{O}{C}-\overset{R}{C}=CH_2$$
$$\diagdown O \diagup \qquad\qquad \diagdown OOC-Y-CO\diagup$$
$$\qquad\qquad\qquad\qquad n(HOOC)\diagup$$

(wherein R is hydrogen or methyl group, A is a group represented by the formula (2), Y is the residue of a polycarboxylic acid or its acid anhydride, and n is integer of 0–3)

$$-O-\underset{R_2}{\overset{R_1}{\bigcirc}}-X-\underset{R_2}{\overset{R_1}{\bigcirc}}-O-$$

(wherein $R_1$ and $R_2$ are hydrogen, an alkyl group with 1–5 carbon atoms, or a halogen and X is —CO—, —SO$_2$—, —C(CF$_3$)$_2$—, —Si(CH$_3$)$_2$—, —CH$_2$—, —C(CH$_3$)$_2$—, —O—, —S—, group represented by the formula (3) or single bond),

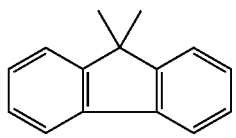 (3)

b) 10–100 parts by weight of (B) which is at least one acrylate selected from the group consisting of:
[CH$_2$=CHCO—(OC$_2$H$_4$)$_1$—OCH$_2$]$_3$—CCH$_2$CH$_3$,
[CH$_2$=CHCO—(OC$_2$H$_4$)$_2$—OCH$_2$]$_3$—CCH$_2$CH$_3$, and
[CH$_2$=CHCO—(OC$_3$H$_6$)$_2$—OCH$_2$]$_3$—CCH$_2$CH$_3$ c) 10–40 parts by weight of (C) compound containing epoxy group and d) 0–10 parts by weight of (D) photopolymerization initiator or sensitizer.

2. A photo- or heat-curable resin composition as described in claim 1 wherein at least a part of the unsaturated compound (A) is an unsaturated compound having the fluorene skeleton represented by the formula (3) in its structural unit.

3. A photo- or heat-curable resin composition as described in claim 1 wherein at least one kind of other unsaturated compound (E) selected from other monomers and oligomers is incorporated at a rate of 100 parts or less per 100 parts by weight of the component A in addition to the components A, B, C and D.

4. A printed wiring board wherein a resin insulation layer is formed by the cured product of a photo- or heat-curable resin composition as described in claim 1.

5. A cured resin formed by curing a photo- or heat-curable resin composition as described in claim 1.

* * * * *